United States Patent [19]

Reichel et al.

[11] 4,129,881

[45] Dec. 12, 1978

[54] HEAT SINK COOLED, SEMICONDUCTOR DEVICE ASSEMBLY HAVING LIQUID METAL INTERFACE

[75] Inventors: Pavel Reichel; Pavel Kafuněk; Jiří Kovář; Oldřich Pokorný; Jaroslav Zůna; Jindřich Kratina; Michal Pellant, all of Prague, Czechoslovakia

[73] Assignee: CKD Praha, oborovy podnik, Prague, Czechoslovakia

[21] Appl. No.: 778,869

[22] Filed: Mar. 18, 1977

[30] Foreign Application Priority Data

Mar. 18, 1976 [CS] Czechoslovakia .................... 1759-76

[51] Int. Cl.² ..................... H01L 23/48; H01L 29/40; H01L 25/04
[52] U.S. Cl. ........................................ 357/82; 357/66; 357/81
[58] Field of Search ................ 357/65, 66, 67, 82, 357/81

[56] References Cited

U.S. PATENT DOCUMENTS

| 3,226,608 | 12/1965 | Coffin | 357/66 |
| 3,248,615 | 4/1966 | Weisshaar | 357/66 |
| 3,475,660 | 10/1969 | Coblenz | 357/82 |
| 3,852,803 | 12/1974 | Walmet et al. | 357/82 |
| 3,858,096 | 12/1974 | Kuhrt et al. | 357/67 |

Primary Examiner—Andrew J. James

[57] ABSTRACT

An improved construction for a two or three terminal power semiconductive device provides efficient thermal and electrical conduction between the heat-generating semiconductive wafer and the associated terminal electrodes with the use of a permanent, flowable thin layer of liquid metal therebetween. The liquid metal is carried in annular reservoirs within the outer surfaces of the terminal electrodes confronting the planar surfaces of the wafer, and serve to conduct the heat from the wafer to a hollow heat-dissipating well within the terminal electrodes. The wall of the well is made porous or is otherwise configured or reinforced to effectively increase the surface area thereof to aid in heat dissipation. If desired, an auxiliary seal-bearing groove is disposed concentric with and radially inwardly of the reservoir on at least one of the terminal electrodes, such groove bearing an O-ring or similar seal which bears against the confronting surface of the wafer to confine the flow of the liquid metal layer.

9 Claims, 3 Drawing Figures

HEAT SINK COOLED, SEMICONDUCTOR DEVICE ASSEMBLY HAVING LIQUID METAL INTERFACE

BACKGROUND OF THE INVENTION

The invention relates to constructions for a power semiconductive device, and more particularly to arrangements employing liquid metal for carrying heat away from the active junctions of the device.

In known constructions of this type, a forced flow of a liquid metal, e.g., of mercury, a eutectic sodium-potassium alloy, and the like, intervenes between each of the planar terminal surfaces of the semiconductive wafer and the adjacent outer surface of the terminal electrode, with the cooling effect being provided by the forced circulation of the liquid metal itself.

In addition to the fact that such heat-dissipation arrangement is relatively complicated and expensive, due in part to the large amount of liquid metal required, it has been found that the efficiency of cooling is far less effective than that provided, e.g., by evaporation from large-area surfaces of the electrodes, as in the earlier prior art.

SUMMARY OF THE INVENTION

The semiconductor device construction of the present invention retains the high electrical and thermal contact between the wafer and the terminal electrodes provided by a liquid metal layer, while at the same time eliminating the expense and disadvantages of employing a forced circulation of such liquid metal to aid in the cooling of the device.

In an illustrative embodiment, each of the terminal electrodes is formed as a cylinder having an internal heat-dissipating well containing a coolant for removing heat transmitted thereto from the wafer, e.g., by evaporation. The well of each electrode is partially bounded by an end wall, the outer surface of which is disposed in confronting spaced relation to one of the planar surfaces of the wafer.

In order to transmit heat from the wafer to the well of the electrode, a thin, permanent, flowable layer of liquid metal is disposed in an annular reservoir on the outer surface of the end wall of each terminal electrode, and adheres by capillary action to the wafer. In general, the liquid layer is confined, by a seal-retaining groove concentric with the reservoir, within the space between the confronting surfaces of the terminal electrodes and the wafer. Preferably, each reservoir is formed as an annular recess in the radially outer portion of the outer surface of each electrode end wall.

An insulating support member is disposed in radially surrounding relation to the outer periphery of the electrodes in symmetric relation to the wafer. Straps or other support means extend between the periphery of the respective electrodes and the support member to yield a unitary assembly.

In one feature of the invention, a pair of the annular reservoirs are disposed in concentric relation on the outer surface of the end wall of each of the terminal electrodes, with the circular wall between the reservoirs being recessed slightly (e.g., between 0.025 and 0.05 mm) with respect to the main portion of the outer surface confronting the wafer.

As another feature of the invention, the side wall of the well in each of the terminal electrodes is provided with a porous sintered layer or other area-increasing facilities to enhance the dissipation of heat from the side wall.

BRIEF DESCRIPTION OF THE DRAWING

The invention is further set forth in the following detailed description taken in conjunction with the appended drawing, in which.

DETAILED DESCRIPTION

Figure 1:
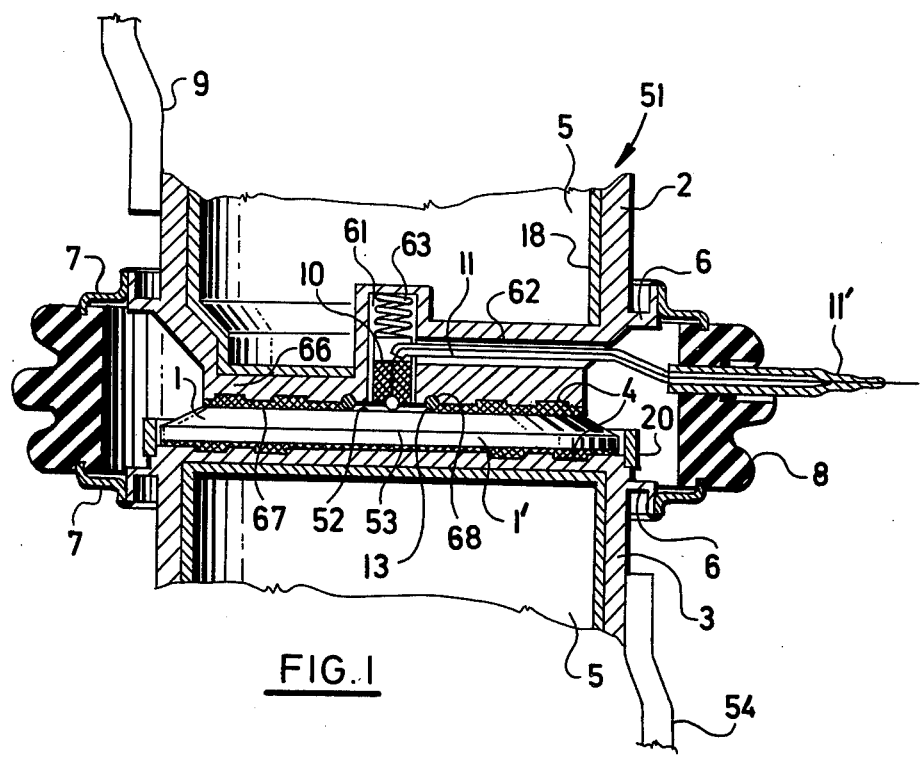
FIG. 1 is a cross-sectional view of a portion of a three-terminal power semiconductive device having heat-dissipation facilities constructed in accordance with the invention.

Referring now to the drawing, FIG. 1 illustrates a thyristor or similar controlled three-terminal semiconductive power element having the heat transfer and dissipation facilities of the invention. The device, represented generally at 51, includes a substantially circular semiconductive wafer 1, which may be formed from silicon. The wafer 1 is provided conventionally with a plurality of active P-N junctions (not shown), which are respectively accessible through a pair of opposed planar surfaces 52, 53 and through a control electrode 10 which is associated with but insulated from the upper surface 52.

A pair of cylindrical terminal electrodes 2, 3 cooperate with the opposed planar surfaces 52, 53, respectively, of the wafer 1 to provide access to such wafer surfaces from a pair of conductive leads 9, 54, which are externally accessible. (In the particular arrangement shown in FIG. 1, a reinforcing conductive disc 1', as of molybdenum or tungsten, is hardsoldered to the lower surface 53 of the wafer 1, so that the conductive path for the lead 54 to the wafer is somewhat longer than that of the opposed lead 9).

In order to form the wafer 1, the disc 1' and the electrodes 2, 3 into an integral assembly, an insulated annular support member 8, illustratively of ceramic material, symmetrically surrounds the periphery of the electrodes 2, 3 as shown. Each of the electrodes 2, 3 has a peripheral rim 6, which is affixed to the member 8 by means of a strap 7.

The electrode 2 associated with the upper surface 52 of the wafer 1 is provided with a central bore 61 concentric with and surrounding the projecting control electrode 10 of the device 51. The bore 61 communicates with a radial channel 62 in the electrode 2, such channel 62 terminating outwardly at the outer surface of the electrode 2. An elongated conductive member 11 extends through the channel 62 and terminates inwardly in superposed relation to the control electrode 10, and is forced thereagainst by means of a spring 63 situated within the bore 61. The outer end of the element 11 is secured within a conductive tube 11', which in turn is mounted within and extends outwardly from the support member 8 to provide external access to the control electrode of the device 51.

In order to dissipate heat generated in the wafer 1 during the operation of the device 51, each of the electrodes 2, 3 is made hollow, and includes a well 5 for receiving a suitable cooling liquid, which emits heat by evaporation through the side wall of the associated electrode. Each well 5 is bounded at its end closest to the wafer by an end wall 66, which terminates in an outer surface 67.

The surface 67 of the upper electrode 2 confronts the upper surface 52 of the wafer through a narrow gap, while the corresponding surface of the electrode 3 confronts the lower surface 53 of the electrode 1 through the reinforcing disc 1'.

The outer surface 67 of each end wall 66 is provided with reservoirs 12 in the form of annular grooves disposed in the radially outward areas of the surfaces 67. In the particular arrangement shown in FIG. 1, two of such reservoirs are shown disposed in concentric relation in each of the surfaces 67.

A thin, permanent metallic layer which is in the liquid state during device operation, is deposited in each of the reservoirs 12, and serves, via capillary action, to fill the space between the surface 67 and the adjacent surface of the wafer with a highly adherent action. The layer 4 is adapted to provide good thermal and electrical conductivity between the wafer and the end wall 66 of each of the electrodes 2, 3, so that heat generated by the wafer during operation is effectively transmitted to the cooling medium within the well 5. Suitable materials for the layer 4 may include, for example, an alloy of indium, tin, lead, bismuth and potassium. The layer, which can be either in solid or liquid form when the device 51 is not in operation, has a thickness preferably smaller than 0.03 mm.

Each of the annular reservoirs 12 may have a width and depth in the range of 0.2–3.2 mm. Preferably, the circular surface between the adjacent ones of the reservoirs 12 illustrated in FIG. 1 is recessed by about 0.025–0.05 mm with respect to the main portion of the surface 67 confronting the wafer 1.

In order to prevent the coating 4 from shorting out the control electrode 10, the surface 67 of the upper electrode 2 may be provided with a seal-bearing annular groove 68 disposed in the surface 67 concentric with and radially inwardly of the reservoirs 12. An O-ring 13 is carried in the groove 68, and contacts the confronting surface 52 of the wafer 1 to provide the required sealing effect.

In order to increase the surface area of the side wall of the electrodes 2, 3 and to thereby increase the efficiency of heat dissipation within the well 5, the inner surface of each of the electrodes may be coated with a layer 18 of a sintered, porous metal, such as nickel. Alternatively, the side wall of the electrodes may be corrugated with suitable pins or ribs to provide the required surface area-increasing effect.

Figure 2:
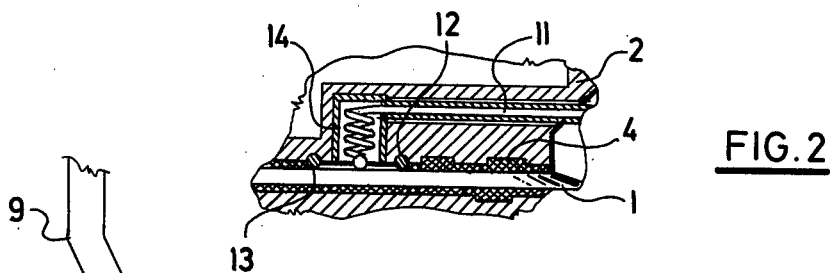
FIG. 2 is a fragmentary sectional view of a portion of FIG. 1, illustrating an alternative arrangement for the third or control terminal of the device.

The arrangement of FIG. 2 shows an alternative construction of the control electrode for the device 51. In this alternative arrangement, a conductive spring 14 extends between the conductive element 11 and the upper surface 52 of the wafer 1. In all other respects, the arrangements of FIGS. 1 and 2 are identical.

Figure 3:
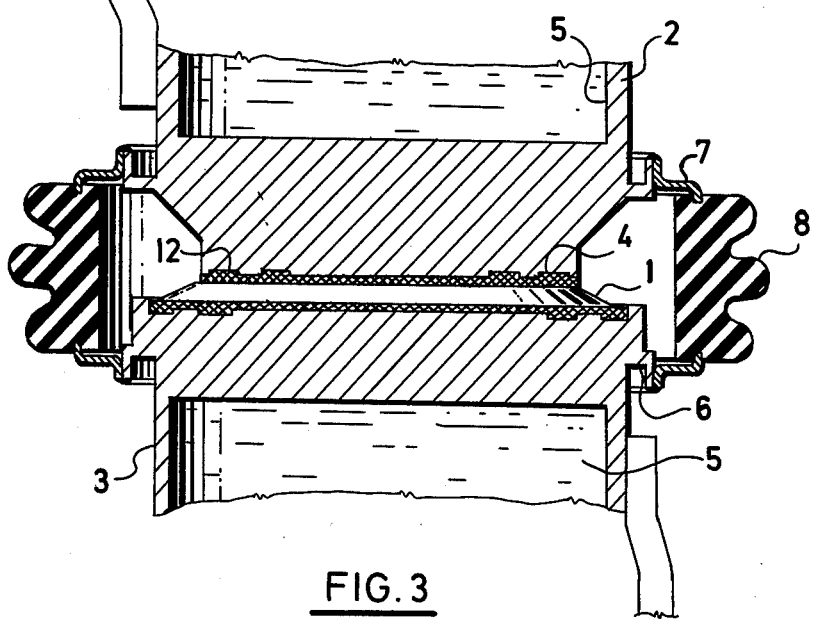
FIG. 3 is a cross-sectional view of a two-terminal power semiconductive device having heat-dissipation facilities in accordance with the invention.

FIG. 3 shows a simplified form of the heat-dissipation arrangement of the invention, in the context of a power semiconductive diode. Corresponding elements of FIGS. 1–2 and of FIG. 3 have been given corresponding reference numerals.

In the arrangement of FIG. 3, the molybdenum or tungsten reinforcing disc 1' has been omitted, and the end wall 66 of the electrodes 2 and 3 have been increased in thickness to enhance their heat capacity and to facilitate the absorption of high transient heat impulses that may arise during the operation of the device. The principle of employing the permanent liquid layer 4, the reservoirs 12, and the separate cooling medium within the internal wells 5 in the electrodes 2, 3 are similar in the arrangement of FIGS. 1–2 and 3.

In the foregoing, some illustrative arrangements of the invention have been described. Many variations and modifications will now occur to those skilled in the art. In addition, the support arrangement represented by the ceramic spacer member 8 may be replaced by any other suitable arrangement. It is accordingly desired that the scope of the appended claims not be limited to the specific disclosure herein contained.

What is claimed is:

1. In a power semiconductor device construction, a substantially circular semiconductive wafer having first and second opposed planar surfaces, first and second cylindrical electrodes each having a first end wall and an internal, heat-dissipating wall partially bounded by a portion of the first end wall, the outer surfaces of the first end walls of the respective first and second electrodes bring individually disposed in confronting spaced relation to and coaxial with the first and second surfaces of the wafer, the outer surface of each first end wall of the respective electrodes having at least two reservoirs in the form of spaced concentric annular recesses disposed in a radially outer region thereof, and a highly conductive, flowable metallic layer disposed within each reservoir and filling the space between the outer surface of each first end wall and the confronting surface of the wafer over a considerable radial extent to effect efficient electrical and heat conduction between the wafer and the wells in the respective first electrodes, an insulating member disposed concentric with and radially outward of the peripheries of the respective first electrodes, and support means carried by the periphery of each first electrode for joining such electrode to the insulating member.

2. A construction as defined in claim 1, in which each internal well is transversely bounded by a side wall, and in which the construction further comprises means associated with the side wall of each well for effectively increasing the surface area of each such side wall.

3. A construction as defined in claim 2, in which the area-increasing means comprises a porous layer disposed on the internal surface of each side wall.

4. A construction as defined in claim 1, in which the outer surface of the first end wall of at least one of the first electrodes has a seal-receiving groove therein concentric with and radially inward of the reservoir.

5. A construction as defined in claim 4, further comprising an annular sealing member situated in the groove and contacting the confronting surface of the wafer to form a barrier to the flow of the metallic layer.

6. A construction as defined in claim 1, in which the first end wall of at least one of the first electrodes has a central bore extending inwardly from the outer surface thereof, and in which the confronting wafer surface has associated therewith a central electrode means projecting concentrically into the central bore of said one of the first electrodes.

7. A construction as defined in claim 1, wherein each of the annular reservoirs has a width and depth in the range of 0.2–3.2 mm.

8. A construction as defined in claim 7, wherein the circular surface between adjacent annular reservoirs is recessed in to a depth of about 0.025–0.05 mm with respect to the main, unrecessed surface of the first end wall of the respective electrode.

9. A construction as defined in claim 3, wherein the porous layer is made of a sintered metal.

* * * * *